United States Patent

Suzuki et al.

[11] Patent Number: 6,087,878
[45] Date of Patent: Jul. 11, 2000

[54] SIGNAL OUTPUT CIRCUIT, PARALLEL INTERFACE CIRCUIT AND PRINTER APPARATUS

[75] Inventors: Noriyuki Suzuki, Tokyo; Sohei Tanaka; Masafumi Wataya, both of Kawasaki; Hiroshi Uemura, Machida; Nobuyuki Tsukada, Fukushima, all of Japan

[73] Assignee: Canon Kabushiki Kaisha, Tokyo, Japan

[21] Appl. No.: 09/006,198

[22] Filed: Jan. 13, 1998

[30] Foreign Application Priority Data

Jan. 31, 1997 [JP] Japan .................................. 9-019377

[51] Int. Cl.$^7$ ...................................................... H03K 5/08
[52] U.S. Cl. ........................ 327/319; 327/321; 327/387
[58] Field of Search .................................. 327/333, 319, 327/321, 309, 313, 162, 387, 108; 326/86, 90

[56] References Cited

U.S. PATENT DOCUMENTS

| | | | |
|---|---|---|---|
| 5,179,558 | 1/1993 | Thacker | 307/306 |
| 5,214,330 | 5/1993 | Okazaki | 326/90 |
| 5,526,161 | 6/1996 | Suzuki et al. | 359/172 |
| 5,598,150 | 1/1997 | Suzuki et al. | 340/825.07 |
| 5,646,553 | 7/1997 | Mitchell | 326/86 |

*Primary Examiner*—Timothy F. Callahan
*Assistant Examiner*—An T. Luu
*Attorney, Agent, or Firm*—Fitzpatrick, Cella, Harper & Scinto

[57] ABSTRACT

An interface in accordance with IEEE 1284 has a signal output stage which is a totem pole circuit. The totem pole circuit may be damaged if its output signal line is left grounded for an extended period of time or if outputs are being delivered at both ends of the signal line. Drive by the totem pole circuit is limited to a case where a signal to be output is at a low level and to a length of time equivalent to, say, one clock period from the moment the signal makes a transition from the low to a high level. A high impedance is established at all other times during which the high level is in effect, with the high level being maintained by a pull-up resistor connected to the output signal line. As a result, the totem pole circuit will not be damaged even if the output line is grounded while at the high level.

16 Claims, 11 Drawing Sheets

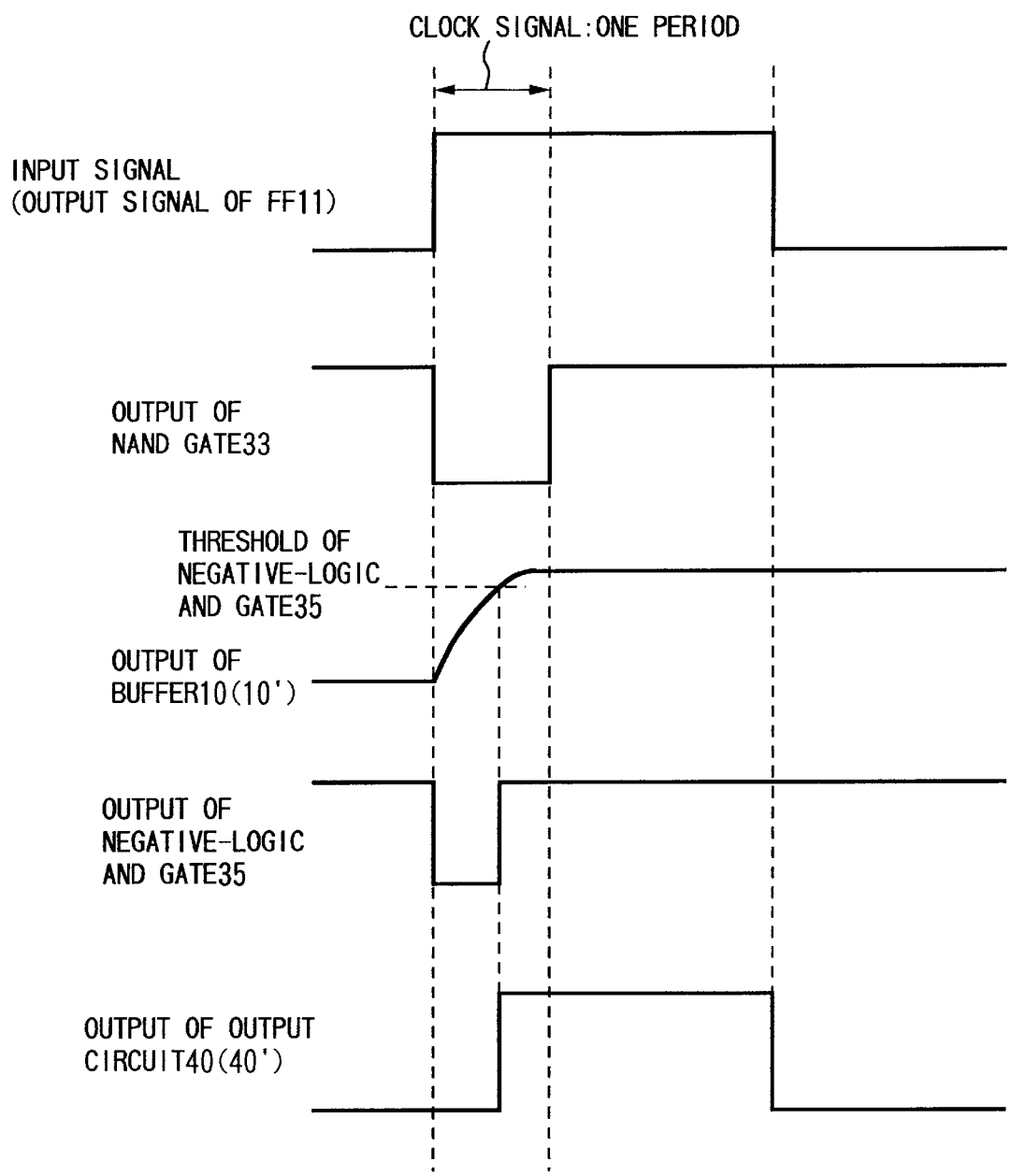

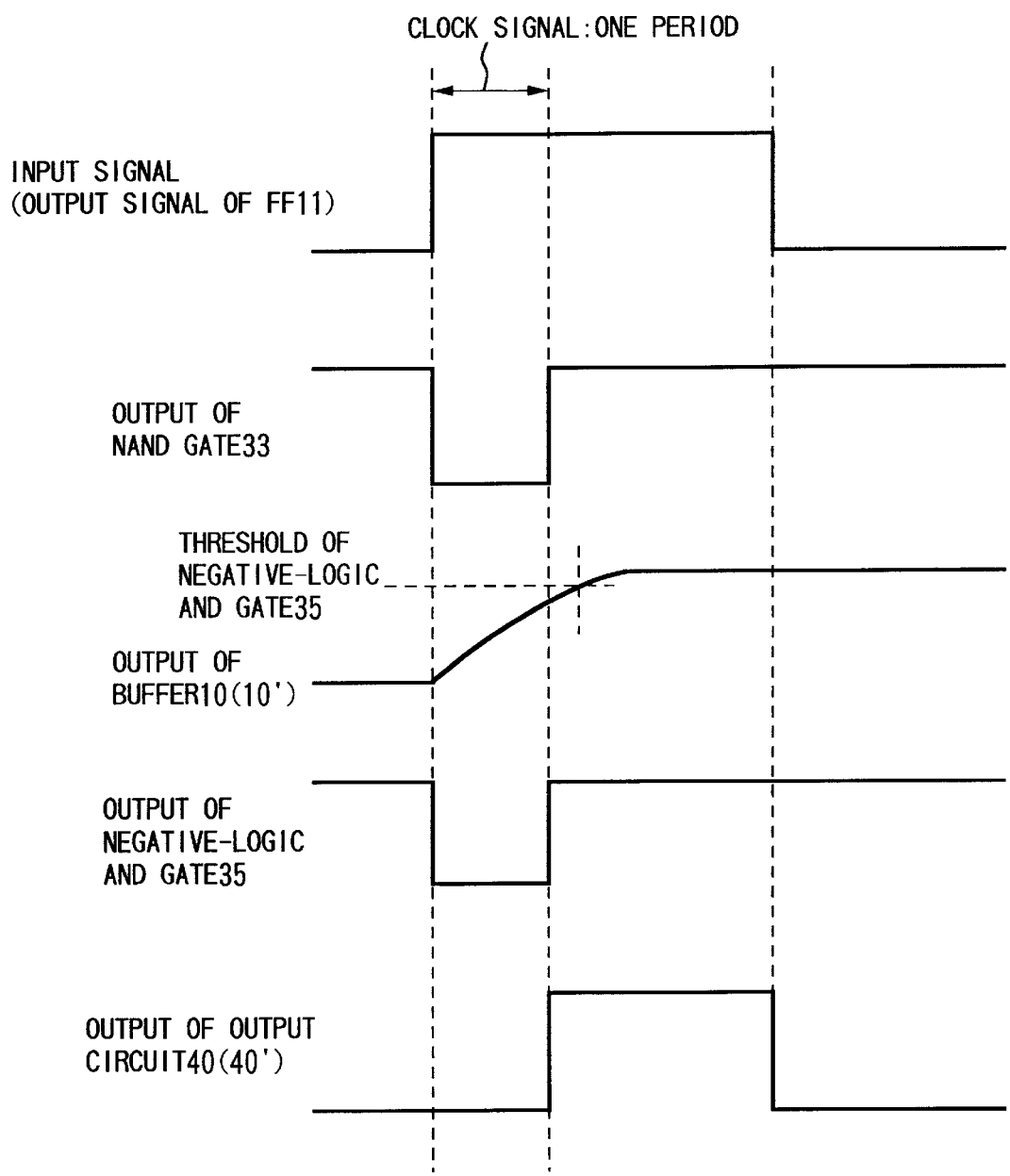

SIGNAL OUTPUT CIRCUIT, PARALLEL INTERFACE CIRCUIT AND PRINTER APPARATUS

BACKGROUND OF THE INVENTION

1. Field of the Invention

This invention relates to a signal output circuit ideal for an interface between a circuit and a device, particularly a parallel interface used widely in a peripheral apparatus such as a printer, a parallel interface circuit and a printer apparatus which uses this parallel interface circuit.

2. Description of the Related Art

It known widely that a parallel interface in conformity with the Centronics standard (this shall be referred to as a "Centronics interface" below) is used to transmit data between a host device such as a personal computer and a peripheral device such as a printer. An open collector circuit is used as the signal output circuit of the Centronics interface.

Since the Centronics interface is designed only for data communication in one direction, namely from the host device to the peripheral device, a bidirectional parallel interface standard having upward compatibility with the Centronics interface has been stipulated by the IEEE. This standard is referred to as "IEEE Std. 1284–1994: Standard Signaling Method for Bi-directional Parallel Peripheral Interface for Personal Computer", or the so-called "IEEE 1284".

The communication modes stipulated by IEEE 1284 include an ECP mode capable of dealing with communication speeds up to a maximum of about 2 megabytes per second. This means that the conventional open collector circuit is too slow to be used as the signal output circuit. This makes it necessary to use a totem pole circuit.

FIG. 10 shows an example of a circuit diagram illustrating a totem pole circuit. If a transistor Tr3 in the totem pole circuit is turned on, transistor Tr1 turn off and the transistor Tr2 turns on. If the transistor Tr3 is turned off, then the transistors Tr1 turns on and the transistor Tr2 turns off. Accordingly, a low-level output is obtained if the transistor Tr3 is turned on and a high-level output if the transistor Tr3 is turned off.

If the signal output circuit is made the totem poll circuit, however, the following problems not seen in the open collector circuit arise:

(1) If the output signal is accidentally left short-circuited to ground or to another output signal for an extended period of time, the elements constituting the signal output circuit will deteriorate or be destroyed. Though such an accident may be prevented by turning off the power supply of the device when a connecting cable is installed, instances in which the operator forgets to turn off power at such time frequently occur. Another conceivable accident is the short-circuiting of output signals within the connecting cable due to aging of the cable.

(2) Data signals are bi-directional in the ECP mode. Consequently, if the data signal is left in the output state in both the host and peripheral devices, the elements of the signal output circuit may sustain deterioration or damage.

There is a possibility that situations such as these may arise when directional control of the data signal fails owing to an event such as runaway of the CPU within the device.

SUMMARY OF THE INVENTION

The present invention concerns improvements in a parallel interface circuit in which a totem pole circuit is used as a signal output circuit and its object is to reduce the danger of deterioration of or damage to elements of the signal output circuit even if an output signal is accidentally short-circuited to ground or to another output signal or the output state is established in both the host device and peripheral device owing to runaway of the CPU within the device.

According to the present invention, the foregoing object is attained by providing a signal output circuit comprising a three-state buffer, a pull-up resistor connected to an output terminal of the three-state buffer, and an output control circuit for outputting an output enable signal to the three-state buffer at a predetermined timing on the basis of the state of an input signal to the three-state buffer.

In another aspect of the present invention, the foregoing object is attained by providing a parallel interface circuit having a signal output circuit comprising, with regard to at least some output signals, a three-state buffer, a pull-up resistor connected to an output terminal of the three-state buffer, and an output control circuit for outputting an output enable signal to the 3-stage buffer at a predetermined timing on the basis of the state of an input signal to the three-state buffer.

In another aspect of the present invention, the foregoing object is attained by providing a printer apparatus having a signal output circuit which includes, in regard to at least some output signals of an interface with another device, a three-state buffer, a pull-up resistor connected to an output terminal of the three-state buffer, and an output control circuit for outputting an output enable signal to the 3-stage buffer at a predetermined timing on the basis of the state of an input signal to the three-state buffer.

In another aspect of the present invention, the foregoing object is attained by providing a signal output circuit for outputting a signal entered in synchronization with a clock signal having a predetermined period, comprising a flop-flop for outputting an input signal upon synchronizing the signal to the clock signal, a first three-state buffer, to which an output signal from the first flop-flop is applied as an input signal, the first three-state buffer attaining a high impedance in response to a disable signal, a pull-up resistor connected to an output terminal of the three-state buffer, and an output control circuit for generating a signal whose leading edge is obtained by delaying the leading edge of an output signal of the flip-flop for at most one period of the clock signal, and whose trailing edge is synchronized to the output signal of the flip-flop, and entering this signal as the disable signal of the first three-state buffer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9A is a diagram showing timings in a case where a buffer output signal value has exceeded a high-level threshold value within one clock period of a leading edge; and FIG. 9B is a diagram showing timings in a case where the output signal value of the buffer has exceeded the high-level threshold value upon passage of a length of time greater than one clock following the leading edge.

DESCRIPTION OF THE PREFERRED EMBODIMENTS (First Embodiment)

A first embodiment of the present invention will now be described.

Figure 8:
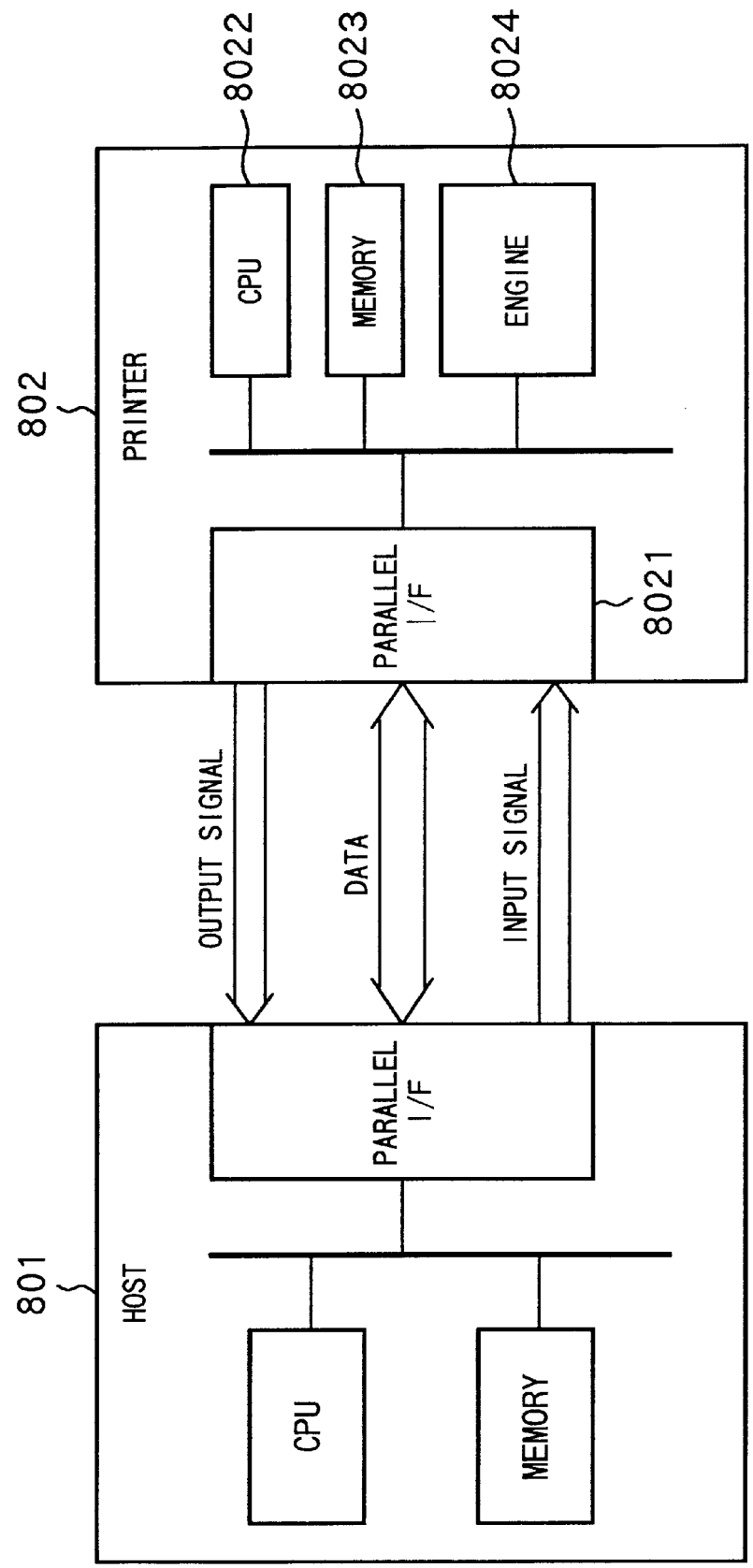
FIG. 8 is a diagram showing the construction of a host computer and printer connected by an interface in accordance with IEEE 1284.
Figure 10:
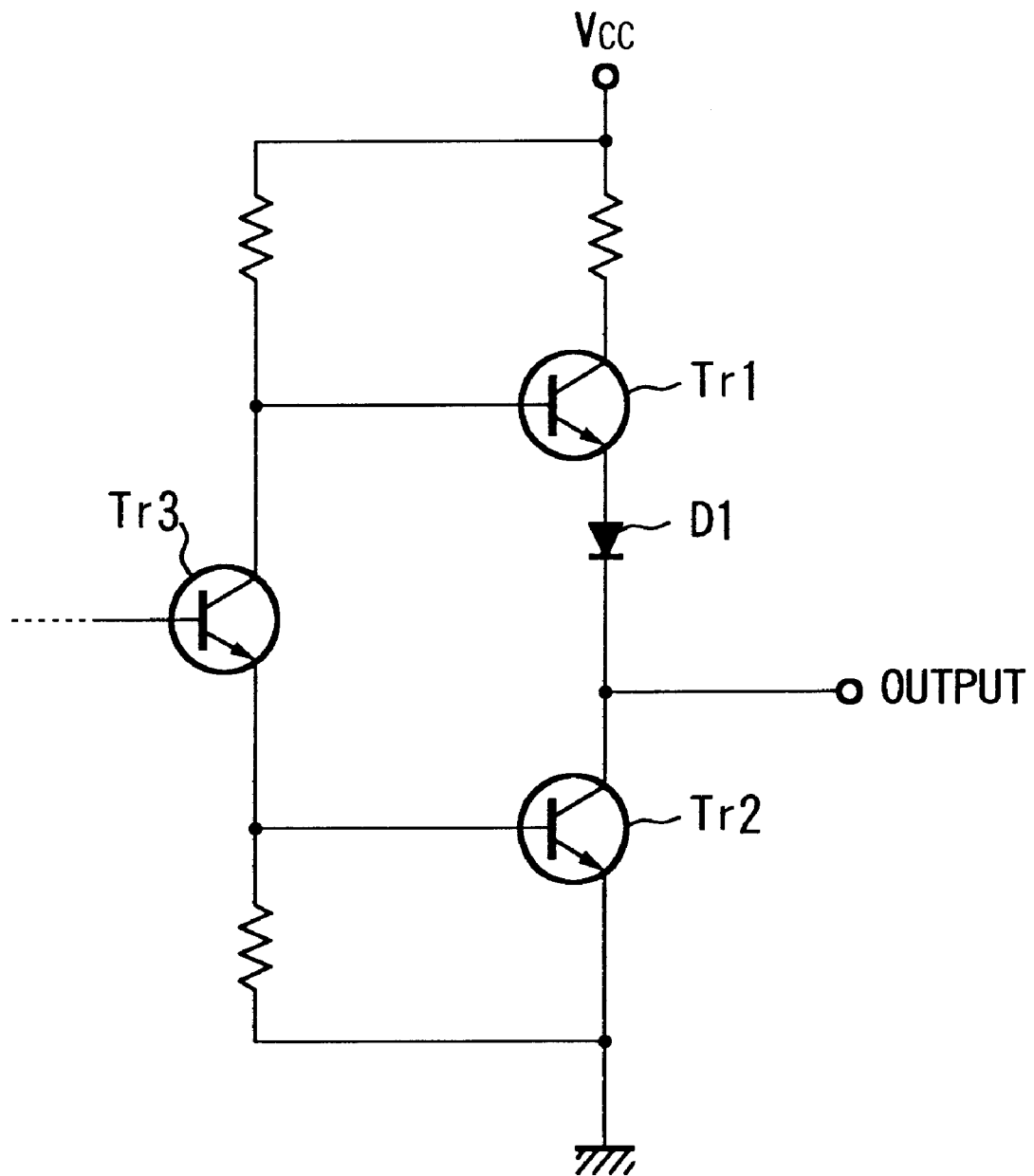
FIG. 10 is a diagram showing an example of a totem pole circuit.

FIG. 8 illustrates an arrangement in which a printer apparatus and a host computer having parallel interface circuits in accordance with the present invention are connected. The printer 802 is connected to the host computer 801 by an IEEE 1284 parallel interface and exchanges data with the host computer. The printer 802, which is controlled by a CPU 8022, produces an output signal as necessary and sends and receives data via a parallel interface circuit 8021. Print data that has been received is printed out by an engine 8024.

Figure 1A:
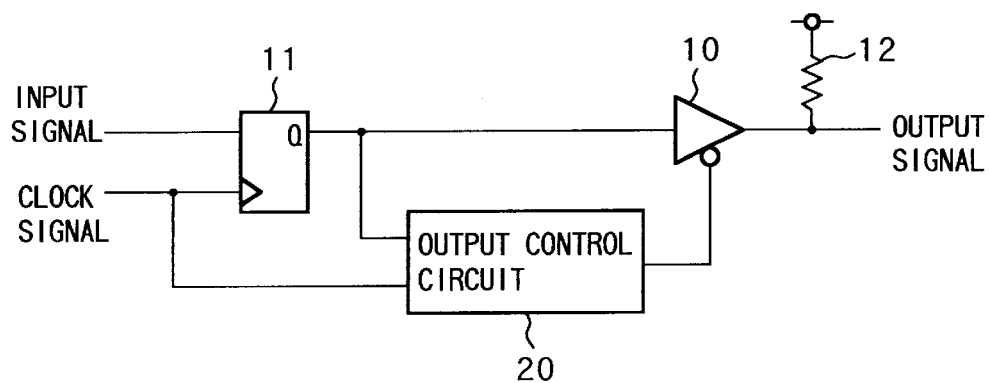
FIGS. 1A and 1B are diagrams showing the construction of signal output circuits of an interface in accordance with IEEE 1284 and embodying the present invention.

FIG. 1A is a diagram showing the construction of a signal output circuit of an IEEE 1284 interface constructing the parallel interface circuit 8021 for outputting each output signal of the printer 802. More specifically, the signal output circuit outputs nAck, Busy, pError, Select and nFault signals. These signal names are those used when a compatibility mode is in effect. In order to avoid confusion, in this embodiment the signal names shall always be the names which prevail in the compatibility mode with relation to the communication mode.

The input signal to this circuit is latched by a flop-flop 11 in sync with a clock signal and is delivered as a final output signal via a three-state buffer 10. The output stage of the three-state buffer 10 is constituted by a totem pole circuit. The output terminal of the three-state buffer 10 is pulled up to 5 V by a resistor 12. The output of an output control circuit is connected to an output-enable input of the three-state buffer 10. The three-state buffer 10 operates only when the output of the output control circuit 20 is at the low level and is at a high impedance at all other times. Since the output enable signal is negative logic, it can also be referred to as a disable signal.

Figure 1B:
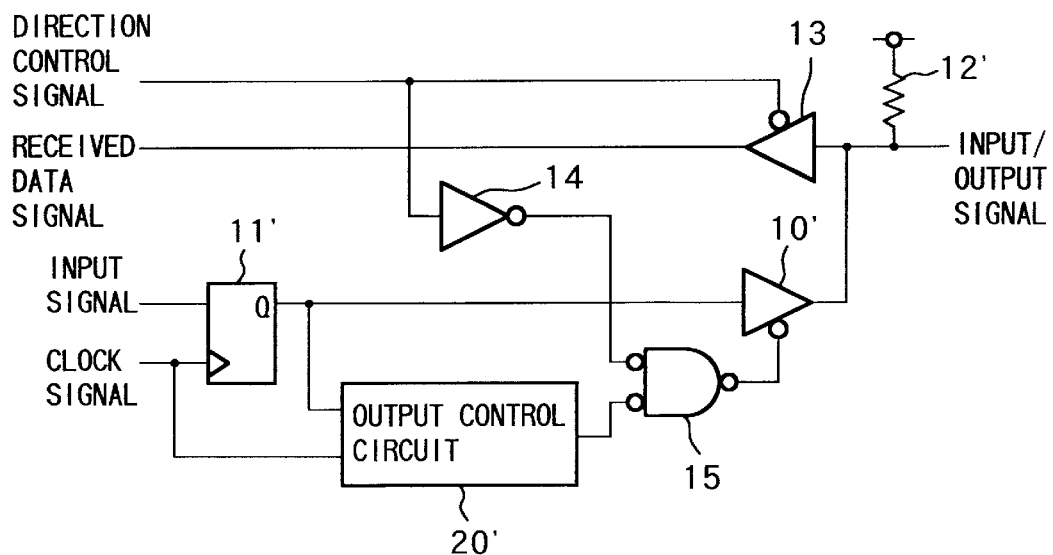

FIG. 1B is a diagram showing the construction of a signal output (input) circuit for each bit of an 8-bit data signal (Data1~Data8). A three-state buffer 10', flip-flop 11', resistor 12' and output control circuit 20, are similar to the three-state buffer 10, flip-flop 11, resistor 12 and output control circuit 20, respectively, shown in FIG. 1A. Since the data signal is bi-directional, this circuit further includes a three-state buffer 13 for inputs. A bi-directional buffer is constructed by the three-state buffers 10' and 13. Directional control of this bi-directional buffer is performed by a direction control signal. The three-state buffer 13 operates when the direction control signal is at the low level and the three-state buffer 10' operates when the direction control signal is at the high level.

The direction control signal is not connected directly to the output enable input of the three-state buffer 10' but is applied to one input thereof via a NOT gate 14 and negative-logic AND gate 15. The output of the output control circuit 20' is connected to the other input of the negative-logic AND gate 15. By virtue of the arrangement described above, the three-state buffer 10' operates only when the direction control signal is high (= output direction) and, moreover, the output of the output control circuit is low. That is, the negative-logic AND gate 15 is controlled in such a manner that the output signal of the output control circuit 20' is applied to the output enable input of the three-state buffer 10' in a case where the direction control signal is high (= output direction).

Figure 2:
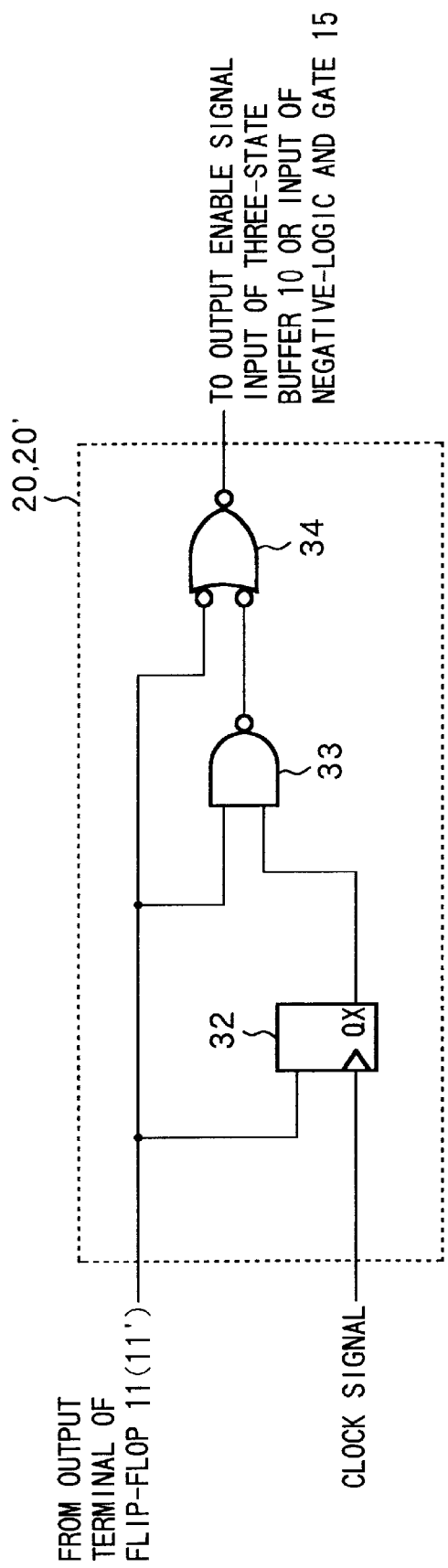
FIG. 2 is a circuit diagram of an output control circuit.
Figure 3A:
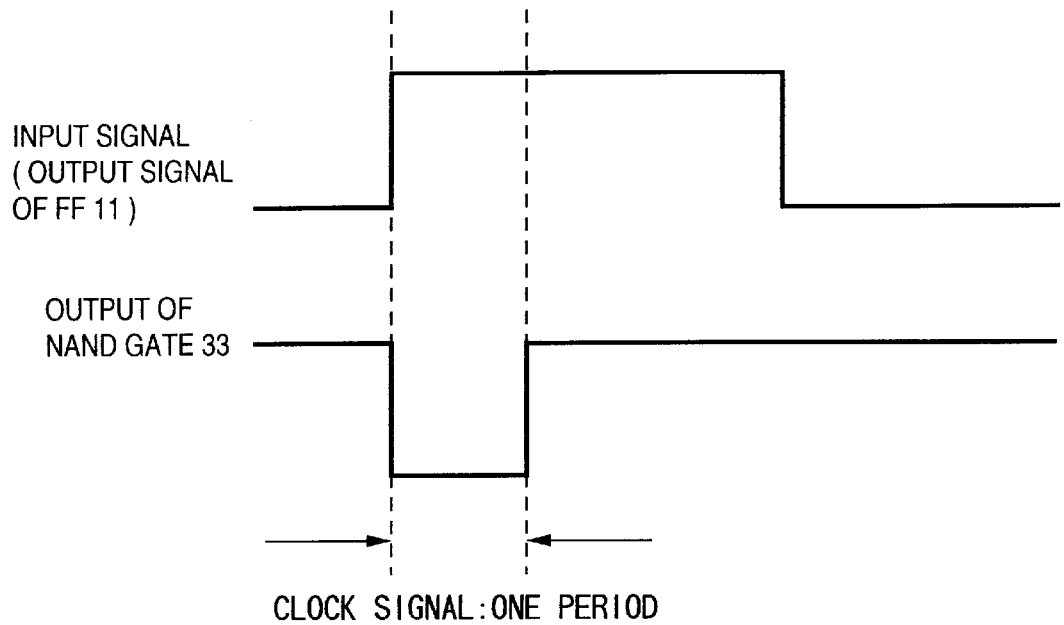
FIGS. 3A and 3B are diagrams showing timings of internal signals of the output control circuit.

FIG. 2 illustrates the details of construction of the output control circuits 20, 20'. As shown in FIG. 2, a flip-flop 32 latches the input signal to the signal output circuit in sync with the clock signal described above with reference to FIGS. 1A, 1B. The above-mentioned input signal and a QX output (inverted output) of the flip-flop 32 enter a NAND gate 33. By virtue of the above arrangement, the output of the NAND gate 33 assumes the low level for a duration equivalent to one period of the clock signal following the rise of the input signal, as shown in FIG. 3A.

Figure 3B:
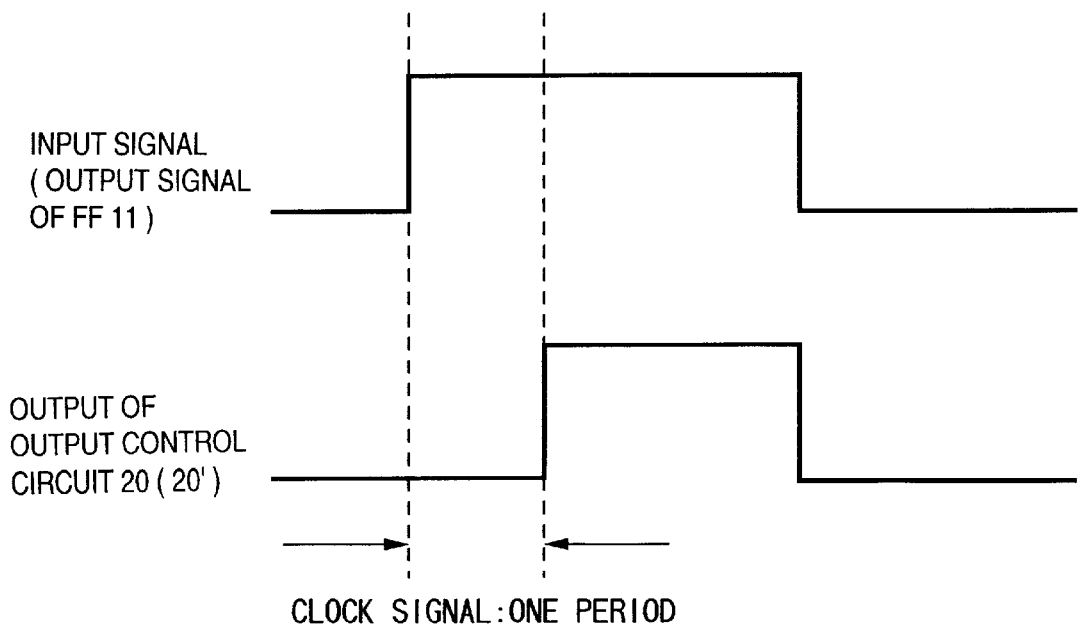

A negative-logic OR gate 34 takes the logical sum of the output of the NAND gate 33 and the input signal. The logical sum is obtained by negative logic. Accordingly, as shown in FIG. 3B, the output signal of the output control circuit 20 (20') is at the low level when the input signal is low and remains at the low level for one period of the clock signal even after the input signal makes a transition to the high level. More specifically, the output of the gate 34, namely the output signal of the output control circuit, is a signal obtained by delaying, for one period of the clock signal, the leading edge of the input signal synchronized to the clock signal by the flip-flop 11, and having its trailing edge synchronized. The period of time during which the output signal (FIG. 3B) of the output control circuit 20 (20') is at the low level is the period during which the three-state buffer 10 (10') is driven as a totem pole circuit. The three-state buffer 10 (10') assumes the high impedance during the period of time that the output signal is at the high level.

Figure 4:
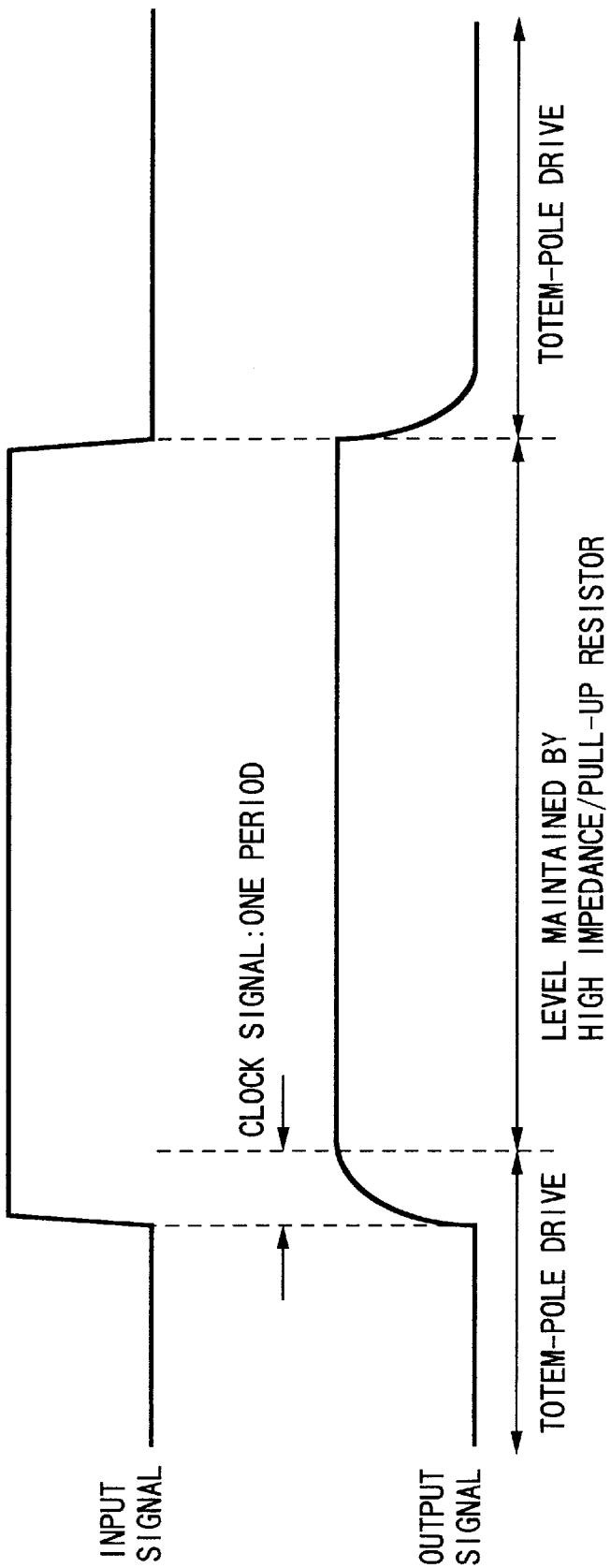
FIG. 4 is a diagram showing the timing of an output signal from a signal output circuit.

FIG. 4 illustrates the output signal finally obtained from the circuit described above. As described above in connection with FIG. 3, the three-state buffer 10 (10') is driven as a totem pole circuit when the input signal to the three-state buffer 10 (10') is low and for a duration equivalent to one period of the clock signal after the input signal rises from the low to the high level. At all other times the output of the three-state buffer 10 (10') is at the high impedance. The output level is held at 5 V by the pull-up resistor 12 (12') when the output of the three-state buffer 10 (10') is at the high impedance.

The period of the clock signal will now be considered. After the output of the three-state buffer 10 (10') has attained a sufficiently high level, the level of the output signal is held at the high level by the pull-up resistor 12 (12') even though the output of the three-state buffer 10 (10') is made a high impedance. This means that it will suffice if one period of the clock signal shown in FIG. 4 is the length of time it takes from the output of the three-state buffer 10 (10') to rise from the low to the high level. It has been found that this length of time is on the order of several tens of nanoseconds to 200 nanoseconds in the case of the IEEE 1284 interface. Accordingly, the period of the clock signal is made approximately 30 to 200 nanoseconds (33~5 MHz).

In accordance with the circuit arrangements described above, the final buffer element (the three-state buffer 10 or 10') of the signal output circuit is operated by totem-pole drive when the output is low and for about 30 to 200 nanoseconds when the output makes a transition from the low to the high level. In other words, the final buffer outputs the high-level signal for only about 30 to 200 nanoseconds.

This means that current flows from the final buffer element only for about 30 to 200 nanoseconds even if the output signal is grounded or short-circuited to another output signal or even if the data signal is placed in the output state in both the host device and printer. Any element damage would be so low as cause no practical problems.

It should be noted that the output duration is not particularly limited in a case where the input signal is at the low level. Since the short-circuiting of low-level signals or the short-circuiting of a low-level signal to ground involves almost no flow of current, no practical problems arise.

In accordance with this embodiment, as described above, the danger of element deterioration or destruction can be reduced greatly even in the event of an accident such as short-circuiting of the output signal to ground or to another output signal or placement of the data signal in the output state in both the host device and printer.

(Second Embodiment)

A three-state buffer is subjected to totem-pole drive for about 30 to 200 nanoseconds, as described in the first embodiment. However, this length of time increases or decreases somewhat depending upon the characteristics of the elements or connecting cable used and the construction of the signal input circuit of the device to which this device is connected. In order to achieve normal operation in any environment, therefore, there are occasions where the above-mentioned length of time must be increased beyond 200 nanoseconds to provide some margin. In totem-pole drive is carried out longer than necessary, however, overshooting of the output signal tends to occur. Since the occurrence of overshoot is a cause of an increase in generated noise or error in the data transmission of the interface, there may be cases where separate countermeasures will be required depending upon the degree of overshoot.

In view of this point, this embodiment is so adapted that the length of time during which totem-pole drive is performed will be made a required satisfactory length of time in dynamic fashion.

Figure 5A:
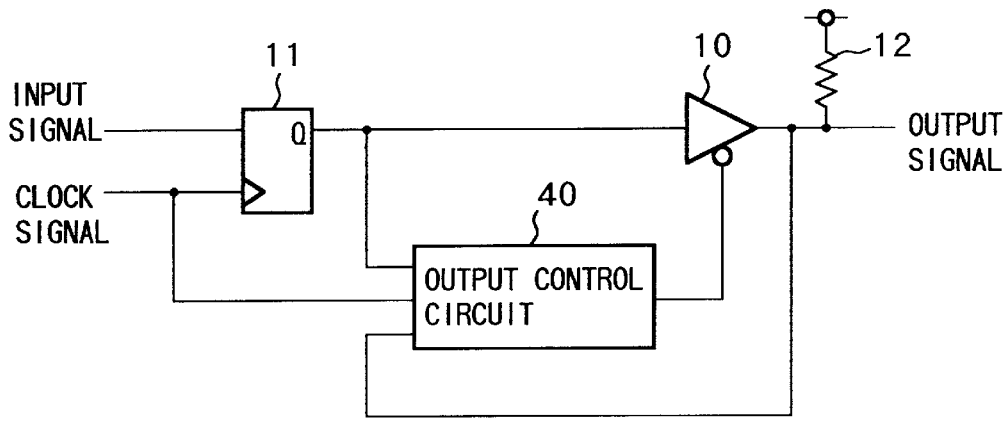
FIGS. 5A and 5B are circuit diagrams of signal output circuits according to a second embodiment of the present invention.
Figure 5B:
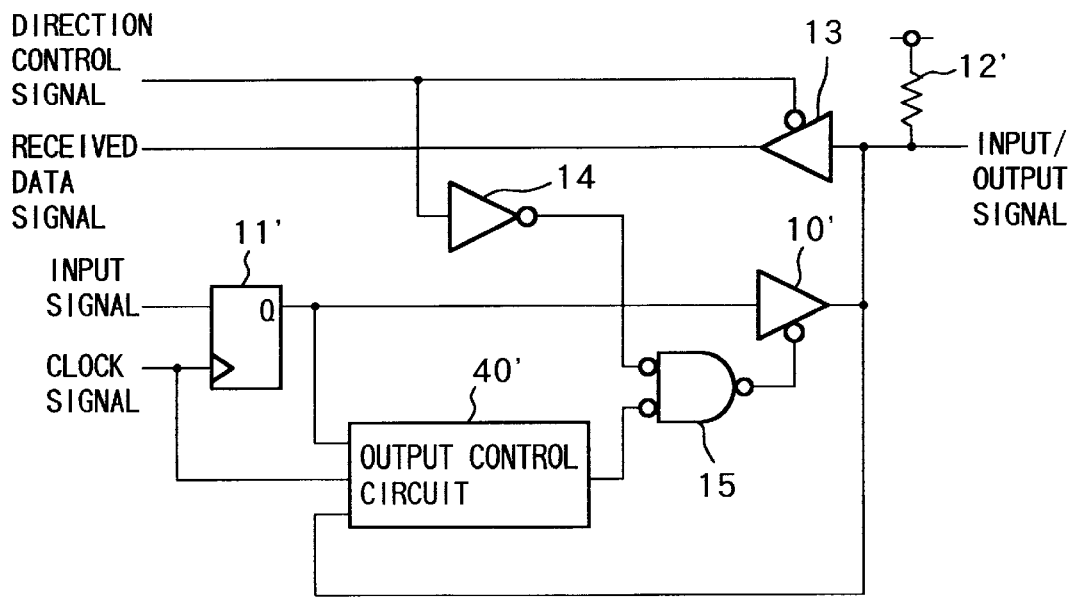

FIGS. 5A and 5B are diagrams showing the construction of signal output circuits of an IEEE 1284 interface according to this embodiment. As in the first embodiment, FIG. 5A shows the construction of a signal output circuit for nack, Busy, pError, Select and nFault signals, and FIG. 5B shows the construction of a signal output (input) circuit for data (Data1~Data 8).

These circuits differ from those shown in FIGS. 1A and 1B in that the output control circuits 20, 20' are replaced by output control circuits 40, 40'. The output signals of the three-state buffers 10, 10' are applied to the output control circuits 40, 40', respectively, as input signals.

Figure 6:
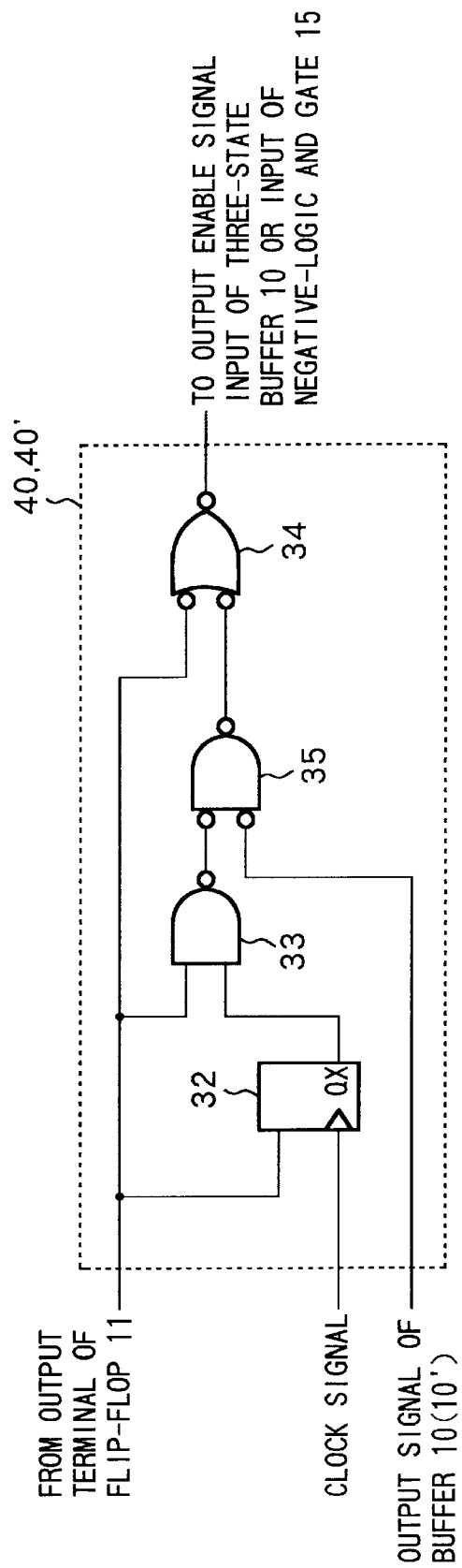
FIG. 6 is a circuit diagram of an output control circuit according to the second embodiment of the present invention.

FIG. 6 illustrates the details of construction of the output control circuits 40, 40'. The flip-flop 32, NAND gate 33 and negative-logic OR gate 34 are the same as those described above with reference to FIG. 2. A negative-logic AND gate 35 controls the output of the NAND gate 33 by the output of the three-state buffer 10 (10'). Accordingly, the output control circuit 40 (40') outputs the low level when the input signal to this signal output circuit is low and for a length of time equivalent to one period of the clock signal when the input signal makes a transition to the high level or for the length of time needed for the output of the three-state buffer 10 (10') to attain the high level, whichever length of time is shorter. If the period of the clock signal is selected to be a length of time having sufficient margin, the period of time required for the output of the three-state buffer 10 (10') to attain the high level will become the shorter period.

FIG. 9A is a diagram showing timings in a case where the output signal value of the buffer 10 (10') has exceeded a high-level threshold value (Vh) of the negative-logic AND gate 35 within one clock following the leasing edge. In this case, the output signal of the negative-logic AND gate 35 rises at the moment the output signal value of the three-state buffer 10 (10') exceeds the threshold voltage (Vh). Accordingly, the output signal of the output control circuit 40 (40') rises upon being delayed from the leading edge of the input signal by the length of time required for the output signal value of the three-state buffer 10 (10') to exceed the threshold voltage (Vh). FIG. 9B is a diagram showing timings in a case where the output signal value of the buffer 10 (10') has exceeded the high-level threshold value (Vh) of the negative-logic AND gate 35 upon passage of a length of time greater than one clock following the leading edge. In this case, the output signal of the negative-logic AND gate 35 rises at the moment the output signal value NAND gate 33 attains the high level. Accordingly, the output signal of the output control circuit 40 (40') rises upon being delayed from the leading edge of the input signal for a length of time equivalent to one clock.

Figure 7:
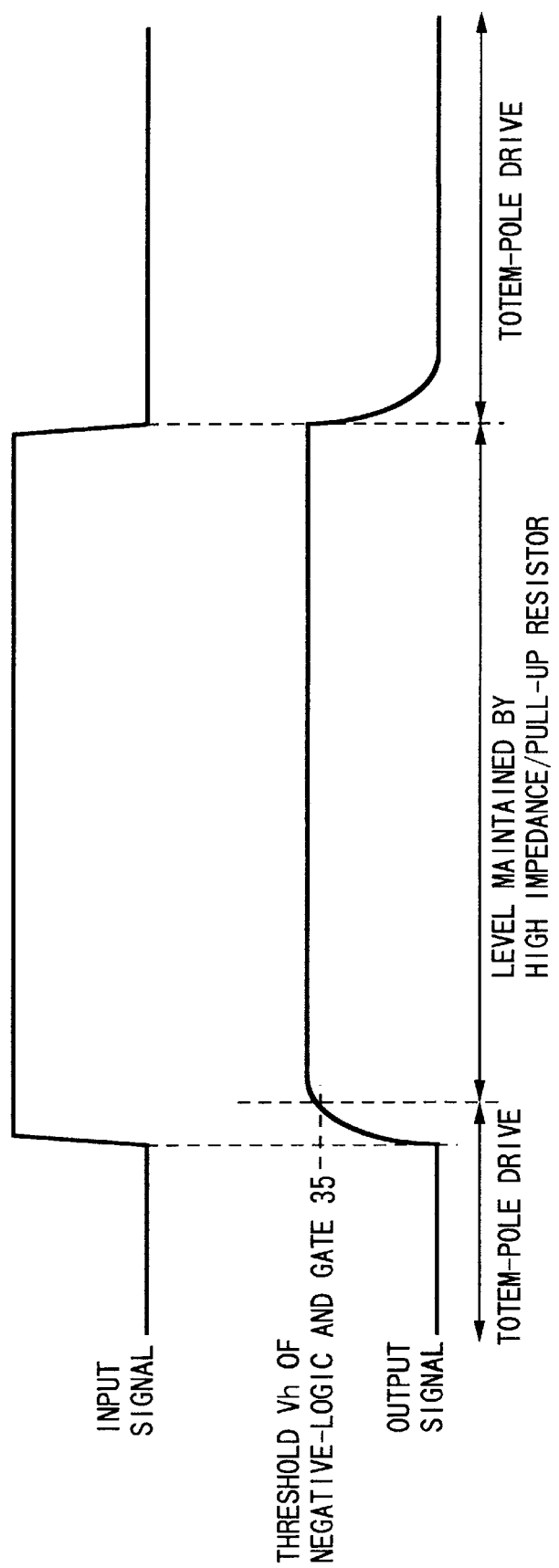
FIG. 7 is a diagram showing the timing of an output signal from the signal output circuit according to the second embodiment.

FIG. 7 is a diagram showing the timing of the final output signal from the circuit described above. It will be understood from FIG. 7 that the three-state buffer 10 (10') is driven as a totem pole circuit when the input signal to the three-state buffer 10 (10') is low and for a length of time required for the output of the three-state buffer 10 (10') to attain the high level after the input signal rises from the low to the high level. At all other times the output of the three-state buffer 10 (10') is at the high impedance and the output level is held at 5 V by the pull-up resistor 12 (12'). The fact that the output of the three-state buffer 10 (10') attains the high level means, more precisely, that the output level of the three-state buffer 10 (10') exceeds the high-level/low-level threshold value of the negative-logic AND gate 35.

Even in the event that the output fails to attain the high level because the output signal of the three-state buffer 10 (10') has been short-circuited to ground, totem-pole drive is terminated, regardless of the level of the output signal, after a length of time equivalent to one period of the clock following the rise in the input signal from the low to the high level.

In accordance with this embodiment, as described above, the danger of element deterioration or destruction can be reduced greatly even in the event of an accident such as short-circuiting of the output signal to ground or to another output signal or placement of the data signal in the output state in both the host device and printer. In addition, since ordinary operation is such that the period of totem-pole drive is sufficiently adjusted automatically, the occurrence of overshoot can be prevented.

A printer equipped with an IEEE 1284 interface has been taken as an example in the first and second embodiments. However, it goes without saying that the present invention is applicable also on the side of the host device, such as a personal computer. The present invention preferably is implemented in both the peripheral and host devices. Further, the present invention is applicable not only to IEEE 1284 interfaces but to other interfaces as well and provides excellent effects in either case.

In accordance with the signal output circuit of the present invention as described above, it is possible to reduce greatly the danger of element deterioration or destruction in the signal output circuit even if the output signal is shorted to ground or to another output signal and even if the CPU within the device runs while out of control. This means that the possibility of malfunction of the device in a case where the above-described trouble has occurred is reduced.

Further, since ordinary operation is, such that the period of totem-pole drive is sufficiently adjusted automatically, the occurrence of overshoot can be prevented.

As many apparently widely different embodiments of the present invention can be made without departing from the spirit and scope thereof, it is to be understood that the invention is not limited to the specific embodiments thereof except as defined in the appended claims.

What is claimed is:

1. An interface apparatus comprising:
   a three-state buffer; and
   a control circuit for controlling the three-state buffer to output a low level signal whenever an input signal to the three-state buffer is at low level, and to output a high level signal during a predetermined period when the input signal to the three-state buffer has switched to high level from low level, and to turn an output of the three-state buffer to a high impedance state after the passing of the predetermined period.

2. The apparatus according to claim 1, wherein said three-state buffer has an output stage which is a totem-pole output stage.

3. An apparatus according to claim 1, wherein the predetermined period is equivalent to one period of a clock signal.

4. An apparatus according to claim 1, wherein the predetermined period is equivalent to a length of time needed for an output signal of the three-state buffer to attain a high level.

5. An apparatus according to claim 1, wherein the predetermined period is equivalent to the shortest period between one period of a clock signal and a time period needed for an output signal of the three-state buffer to attain a high level.

6. The apparatus according to claim 1, further comprising a pull-up resistor connected to an output terminal of the three state buffer.

7. A printer apparatus having an interface circuit and print means, said interface circuit comprising:
   a three-state buffer; and
   a control circuit for controlling the first three-state buffer to output a low level signal whenever an input signal to the first three-state buffer is at low level, and to output a high level signal during a predetermined period when the input signal to the first three-state buffer has switched to high level from low level, and to turn an output of the first three-state buffer to a high impedance state after the passing of the predetermined period
   wherein said print means performs a print based on print data inputted from said interface circuit.

8. An apparatus according to claim 7, wherein the predetermined period is equivalent to one period of a clock signal.

9. An apparatus according to claim 7, wherein the predetermined period is equivalent to a length of time needed for an output signal of the three-state buffer to attain a high level.

10. An apparatus according to claim 7, wherein the predetermined period is equivalent to the shortest period between one period of a clock signal and a time period needed for an output signal of the three-state buffer to attain a high level.

11. The apparatus according to claim 7, wherein the three-state buffer has an output stage which is a totem-pole output stage.

12. The apparatus according to claim 7, wherein said print means includes an ink-jet printer unit.

13. A signal output circuit comprising:
   a first three-state buffer;
   a pull-up resistor connected to an output terminal of said first three-state buffer;
   an output control circuit for outputting an output enable signal to said first three-state buffer at a predetermined timing on the basis of the state of an input signal to said first three-state buffer; and
   a second three-state buffer to which an input signal is entered from a signal line shared by an output signal from said three-state buffer,
   wherein said output control circuit, in the absence of an output enable signal to said second three-state buffer, always outputting an output enable signal to said first three-state buffer in a case where the input signal to said first three-state buffer is at a low level, and outputting an output enable signal to said first three-state buffer for a predetermined length of time after the input signal has made a transition from the low level to a high level,
   wherein said output control circuit not outputting an output enable signal to said first three-state buffer in the presence of an output enable signal to said second three-state buffer, said first three-state buffer outputting a low-level or high-level signal based upon the input signal for a length of time during which the output enable signal is being output, the output of said three-state buffer being a high impedance at all other times.

14. A signal output circuit comprising:
   a first three-state buffer;
   a pull-up resistor connected to an output terminal of said first three-state buffer;
   an output control circuit for outputting an output enable signal to said first three-state buffer at a predetermined timing on the basis of the state of an input signal to said first three-state buffer; and
   a second three-state buffer to which an input signal is entered from a signal line shared by an output signal from said three-state buffer,
   wherein said output control circuit, in the absence of an output enable signal to said second three-state buffer, always outputting an output enable signal to said first three-state buffer in a case where the input signal to said first three-state buffer is at a low level, and outputting an output enable signal to said first three-state buffer for a length of time required for an output signal of said first three-state buffer to attain a high level or for a predetermined length of time after the input signal has made a transition from the low level to a high level,
   wherein said output control circuit not outputting an output enable signal to said first three-state buffer in the presence of an output enable signal to said second three-state buffer, said first three-state buffer outputting a low-level or high-level signal based upon the input signal for a length of time during which the output enable signal is being output, the output of said three-state buffer being a high impedance at all other times.

15. A signal output circuit for outputting a signal entered in synchronization with a clock signal having a predetermined period, comprising:

a flop-flop for outputting an input signal upon synchronizing the signal to the clock signal;

a first three-state buffer, to which an output signal from said first flip-flop is applied as an input signal, said first three-state buffer attaining a high impedance in response to a disable signal;

a pull-up resistor connected to an output terminal of said three-state buffer;

an output control circuit for generating a signal whose leading edge is obtained by delaying the leading edge of an output signal of said flip-flop for at most one period of the clock signal, and whose trailing edge is synchronized to the output signal of said flip-flop, and entering this signal as the disable signal of said first three-state buffer;

a second three-state buffer to which an input signal is entered from a signal line shared by an output signal from said first three-state buffer, said second three-state buffer attaining a high impedance in response to a disable signal; and a gate for entering a signal, produced by said output control circuit, as a disable signal of said first three-state buffer if said second three-state buffer has been disabled.

16. The signal output circuit according to claim 15, wherein said output control circuit delays the leading edge of the output signal of said flip-flop for a length of time equivalent to one period of the clock signal or for a length of time needed for an output signal of said first three-state buffer to attain a high level, whichever length of time is shorter.

* * * * *

UNITED STATES PATENT AND TRADEMARK OFFICE
CERTIFICATE OF CORRECTION

PATENT NO. : 6,087,878　　　　　　　　　　　　　　　　　　　　　　　　Page 1 of 1
DATED : July 11, 2000
INVENTOR(S) : Noriyuki Suzuki et al.

It is certified that error appears in the above-identified patent and that said Letters Patent is hereby corrected as shown below:

<u>Title page,</u>
Item [56], *Primary Examiner*: "Timothy F. Callahan" should read
-- Timothy P. Callahan --.

<u>Column 1,</u>
Line 38, "turn" should read -- turns --;
Line 40, "transistors" should read -- transistor --; and
Line 44, "poll" should read -- pole --.

<u>Column 3,</u>
Line 64, "circuit 20," should read -- circuit 20' --.

<u>Column 5,</u>
Line 41, "In" should read -- If --; and
Line 55, "nack," should read -- nAck, --.

<u>Column 7,</u>
Line 14, "is," should read -- is --.

Signed and Sealed this

Twenty-fourth Day of September, 2002

Attest:

*Attesting Officer*

JAMES E. ROGAN
*Director of the United States Patent and Trademark Office*